(12) United States Patent
Iwata et al.

(10) Patent No.: US 11,264,560 B2
(45) Date of Patent: Mar. 1, 2022

(54) MINIMAL THICKNESS, LOW SWITCHING VOLTAGE MAGNETIC FREE LAYERS USING AN OXIDATION CONTROL LAYER AND MAGNETIC MOMENT TUNING LAYER FOR SPINTRONIC APPLICATIONS

(71) Applicant: Headway Technologies, Inc., Milpitas, CA (US)

(72) Inventors: Jodi Mari Iwata, San Carlos, CA (US); Guenole Jan, San Jose, CA (US); Santiago Serrano Guisan, San Jose, CA (US); Luc Thomas, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 16/448,362

(22) Filed: Jun. 21, 2019

(65) Prior Publication Data
US 2020/0403143 A1     Dec. 24, 2020

(51) Int. Cl.
*H01L 43/10*  (2006.01)
*H01L 43/04*  (2006.01)
(Continued)

(52) U.S. Cl.
CPC ........... *H01L 43/02* (2013.01); *H01F 10/329* (2013.01); *H01F 10/3254* (2013.01);
(Continued)

(58) Field of Classification Search
CPC ...................................................... H01L 43/12
See application file for complete search history.

(56) References Cited

U.S. PATENT DOCUMENTS

| 5,041,782 A | 8/1991 | Marzan |
|---|---|---|
| 6,166,948 A | 12/2000 | Parkin et al. |

(Continued)

FOREIGN PATENT DOCUMENTS

| JP | H 11337527 | 12/1999 |
|---|---|---|
| JP | 2005150303 | 6/2005 |

(Continued)

OTHER PUBLICATIONS

"Current-driven excitation of magnetic multilayers," by J.C. Slonczewski, Journal of Magnetism and Magnetic Materials 159, L-1-L-7, Elsevier, Jun. 1996.

(Continued)

*Primary Examiner* — Omar F Mojaddedi
(74) *Attorney, Agent, or Firm* — Saile Ackerman LLC; Stephen B. Ackerman

(57) ABSTRACT

A perpendicular magnetic tunnel junction is disclosed wherein first and second interfaces of a free layer (FL) with a first metal oxide (Hk enhancing layer) and second metal oxide (tunnel barrier), respectively, produce perpendicular magnetic anisotropy (PMA) to provide thermal stability to 400° C. Insertion of an oxidation control layer (OCL) such as Mg and a magnetic moment tuning layer (MMTL) like Mo or W enables FL thickness to be reduced below 10 Angstroms while providing sufficient PMA for a switching voltage substantially less than 500 mV at a 10 ns pulse width and 1 ppm defect rate. Magnetoresistive ratio is ≥1, and resistance×area (RA) product is below 5 ohm-μm². Embodiments are provided where MMTL and OCL materials interface with each other, or do not contact each other. Each of the MMTL and OCL materials may be deposited separately, or at least one is co-deposited with the FL.

17 Claims, 7 Drawing Sheets

(51) Int. Cl.
  *H01L 43/14* (2006.01)
  *H01L 43/12* (2006.01)
  *H01L 27/22* (2006.01)
  *G11C 11/16* (2006.01)
  *H01L 43/02* (2006.01)
  *H01L 43/06* (2006.01)
  *H01F 10/32* (2006.01)

(52) U.S. Cl.
  CPC ....... *H01F 10/3268* (2013.01); *H01L 27/222* (2013.01); *H01L 43/06* (2013.01); *H01L 43/10* (2013.01); *H01L 43/12* (2013.01)

(56) References Cited

U.S. PATENT DOCUMENTS

| | | | |
|---|---|---|---|
| 6,544,801 | B1 | 4/2003 | Slaughter et al. |
| 6,614,630 | B2 | 9/2003 | Horng et al. |
| 6,743,503 | B1 | 6/2004 | Chen |
| 6,834,005 | B1 | 12/2004 | Parkin |
| 6,847,510 | B2 | 1/2005 | Childress et al. |
| 6,974,708 | B2 | 12/2005 | Horng et al. |
| 7,183,120 | B2 | 2/2007 | Berg et al. |
| 7,335,961 | B2 | 2/2008 | Guo et al. |
| 7,417,442 | B2 | 8/2008 | Hachisuka et al. |
| 7,486,551 | B1 | 2/2009 | Li et al. |
| 7,545,139 | B2 | 6/2009 | Saruki et al. |
| 7,576,956 | B2 | 8/2009 | Huai |
| 7,586,781 | B2 | 9/2009 | Saitoh et al. |
| 7,630,232 | B2 | 12/2009 | Guo |
| 7,635,902 | B2 | 12/2009 | Rizzo et al. |
| 7,666,467 | B2 | 2/2010 | Parkin |
| 7,742,263 | B2 | 6/2010 | Fukumoto et al. |
| 7,817,462 | B2 | 10/2010 | Miura et al. |
| 7,863,060 | B2 | 1/2011 | Belen et al. |
| 7,902,579 | B2 | 3/2011 | Lim et al. |
| 7,936,627 | B2 | 5/2011 | Fukami |
| 7,973,351 | B2 | 7/2011 | Marukame et al. |
| 8,009,464 | B2 | 8/2011 | Kajiyama |
| 8,102,174 | B2 | 1/2012 | Worledge et al. |
| 8,264,693 | B2 | 9/2012 | Stoica et al. |
| 8,379,429 | B2 | 2/2013 | Ishiwata et al. |
| 8,470,462 | B2 | 6/2013 | Horng et al. |
| 8,580,583 | B2 | 11/2013 | Lee et al. |
| 8,592,927 | B2 | 11/2013 | Jan et al. |
| 8,710,603 | B2 | 4/2014 | Jan et al. |
| 8,921,961 | B2 | 12/2014 | Kula et al. |
| 8,959,980 | B2 | 2/2015 | Vodnick et al. |
| 9,006,704 | B2 | 4/2015 | Jan et al. |
| 9,030,216 | B2 | 5/2015 | Lamson et al. |
| 9,048,411 | B2 | 6/2015 | Jan et al. |
| 9,172,032 | B2 | 10/2015 | Shen et al. |
| 9,368,551 | B2 | 6/2016 | Masuoka et al. |
| 9,425,387 | B1* | 8/2016 | Liu .......... H01L 43/08 |
| 9,614,258 | B2 | 4/2017 | Takahashi et al. |
| 9,666,529 | B2 | 5/2017 | Huang et al. |
| 9,711,202 | B2 | 7/2017 | Kim et al. |
| 9,846,134 | B2 | 12/2017 | Yang et al. |
| 9,966,529 | B1 | 5/2018 | Iwata et al. |
| 10,128,309 | B2 | 11/2018 | Tahmasebi et al. |
| 10,192,600 | B2 | 1/2019 | Uchida et al. |
| 2003/0184921 | A1 | 10/2003 | Sugita et al. |
| 2004/0252539 | A1 | 12/2004 | Parkin |
| 2007/0253122 | A1 | 11/2007 | Fukuzawa et al. |
| 2008/0137405 | A1 | 6/2008 | Ohno et al. |
| 2008/0191295 | A1 | 8/2008 | Ranjan et al. |
| 2008/0204946 | A1 | 8/2008 | Ochiai et al. |
| 2008/0278867 | A1* | 11/2008 | Fukumoto .......... H01F 10/3254 360/324.12 |
| 2009/0212769 | A1 | 8/2009 | Stoica et al. |
| 2009/0213503 | A1 | 8/2009 | Sun et al. |
| 2009/0257151 | A1 | 10/2009 | Zhang et al. |
| 2009/0303779 | A1 | 12/2009 | Chen et al. |
| 2010/0023294 | A1 | 1/2010 | Fan et al. |
| 2010/0072524 | A1 | 3/2010 | Huai et al. |
| 2010/0090261 | A1 | 4/2010 | Zheng et al. |
| 2010/0096716 | A1 | 4/2010 | Ranjan et al. |
| 2011/0006384 | A1 | 1/2011 | Peng et al. |
| 2011/0014500 | A1 | 1/2011 | Horng et al. |
| 2011/0032644 | A1 | 2/2011 | Watts et al. |
| 2012/0023386 | A1 | 1/2012 | Oh et al. |
| 2012/0025338 | A1 | 2/2012 | Ranjan et al. |
| 2012/0068285 | A1 | 3/2012 | Kitagawa et al. |
| 2012/0135273 | A1* | 5/2012 | Horng .......... H01F 41/307 428/828.1 |
| 2012/0205758 | A1 | 8/2012 | Jan et al. |
| 2012/0326712 | A1 | 12/2012 | Tudosa et al. |
| 2014/0037990 | A1 | 2/2014 | Abraham et al. |
| 2014/0070800 | A1 | 3/2014 | Cho et al. |
| 2014/0097841 | A1 | 4/2014 | Yang et al. |
| 2014/0355152 | A1 | 12/2014 | Park et al. |
| 2016/0211442 | A1 | 7/2016 | Cao et al. |
| 2016/0284763 | A1 | 9/2016 | Tahmasebi et al. |
| 2016/0372212 | A1 | 12/2016 | Kishi |
| 2017/0084836 | A1 | 3/2017 | Kim et al. |
| 2017/0170391 | A1 | 6/2017 | Hu et al. |
| 2018/0005746 | A1 | 1/2018 | Thomas et al. |
| 2018/0175287 | A1* | 6/2018 | Liu .......... H01L 27/222 |

FOREIGN PATENT DOCUMENTS

| | | |
|---|---|---|
| JP | 2007123640 | 5/2007 |
| WO | WO 2007015474 | 2/2007 |

OTHER PUBLICATIONS

"A perpendicular-anisotropy CoFeB—MgO magnetic tunnel junction," by S. Ikeda et al., Nature materials, Published online: Jul. 11, 2010/ DOI: 10.1038/NMAT2804, www.nature.com/naturematerials, pp. 1-4.

Current-induced domain wall motion in perpendicularly magnetized CoFeB nanowire, by S. Fukami et al., Applied Physics Letters 98, 082504 (2011) Feb. 2011, doi: http://dx.doi.org/10.1063/1.3558917, pp. 1-3.

"Growth, structure, electroic, and magnetic properties of MgO/Fe(001) bilayers and Fe/MgO/Fe(001) trilayers," by M. Klaua et al., Physical Review B, vol. 64, 134411, Sep. 2001, pp. 1-8.

NEC Corp., International Search Report, Application No. PCT/JP2009/050287, dated Apr. 21, 2009, 2 pages.

PCT Search Report, International Application No. PCT/US12/35097, Applicant: MagIC Technologies, Inc., dated Jul. 16, 2012, 13 pages.

"Vector network analyzer ferromagnetic resonance of thin films on coplanar waveguides: Comparison of different evaluation methods," by C. Bilzer et al., AIP Journal of Applied Physics 101, 074505 (2007); Apr. 12, 2007, American Institute of Physics, http://dx.doi.org/10.1063/1.2716995, 5 pgs.

"Open-Circuit One-Port Network Analyzer Ferromagnetic Resonance," by C. Bilzer et al., IEEE Transactions on Magnetics, vol. 44, No. 11, Nov. 2008, pp. 3265-3268.

"Microwave susceptibility of thin ferromagnetic films: metrology and insight into magnetization dynamics," by Claus Bilzer, Jan. 8, 2008, Universite Paris Sud—Paris XI, 2007, Chapter 2.1.1, 2.1.2, 12pgs.

"An N-Way Hybrid Power Divider," by Ernest J. Wilkinson, IRE Transactions on Microwave Theory and Techniques, vol. 8, Issue: 1, Jan. 1960, pp. 116-118.

"High-temperature thermal stability driven by magnetization dilution in CoFeB free layers for spin-transfer-torque magnetic random access memory," by Jodi M. Iwata-Harms et al., Scientific Reports, vol. 8, Article No. 14409 (2018), Sep. 26, 2018, pp. 1-7.

PCT Search Report, International Application No. PCT/US2013/050190, Applicant: Headway Technologies, Inc., dated Oct. 28, 2013, 10 pages.

PCT Search Report, International Application No. PCT/US12/70321, Applicant: Headway Technologies, Inc., dated Mar. 4, 2013, 12 pages.

U.S. Office Action, U.S. Appl. No. 16/448,348, Applicant: Guisan et al., dated May 20, 2021, 19 pages.

(56) References Cited

OTHER PUBLICATIONS

U.S. Notice of Allowance, U.S. Appl. No. 16/448,348, Applicant: Guisan et al., dated Aug. 17, 2021, 16 pages.

* cited by examiner

| Element | Oxide | Free energy of formation per mol of $O_2$ ($\times 10^{-6}$ J.kmol$^{-1}$) |
|---------|-------|---------|
| Au | $Au_2O_3$ | 109 |
| Ag | $Ag_2O_3$ | −7 |
| Ru | $RuO_2$ | −253 |
| Cu | CuO | −254 |
| Co | CoO | −426 |
| Ni | NiO | −432 |
| Fe | FeO | −488 |
| Fe | $Fe_2O_3$ | −495 |
| Mo | $MoO_2$ | −502 |
| W | $WO_3$ | −509 |
| Sn | SnO | −514 |
| Zn | ZnO | −636 |
| Cr | $Cr_2O_3$ | −699 |
| Nb | $Nb_2O_5$ | −708 |
| Ta | $Ta_2O_5$ | −788 |
| B | $B_2O_3$ | −796 |
| Si | $SiO_2$ | −805 |
| Mn | $Mn_2O_3$ | −854 |
| Ti | $TiO_2$ | −890 |
| Zr | $ZrO_2$ | −1037 |
| Al | $Al_2O_3$ | −1053 |
| Ba | BaO | −1056 |
| Hf | $HfO_2$ | −1084 |
| Mg | MgO | −1146 |
| Ca | CaO | −1208 |

FIG. 14

MINIMAL THICKNESS, LOW SWITCHING VOLTAGE MAGNETIC FREE LAYERS USING AN OXIDATION CONTROL LAYER AND MAGNETIC MOMENT TUNING LAYER FOR SPINTRONIC APPLICATIONS

RELATED PATENT APPLICATIONS

This application is related to the following: U.S. Pat. Nos. 8,592,927; 8,710,603; and 9,966,529, which are assigned to a common assignee and herein incorporated by reference in their entirety.

TECHNICAL FIELD

The present disclosure relates to a perpendicular magnetic tunnel junction (p-MTJ) comprised of a free layer that interfaces with a tunnel barrier layer and an Hk enhancing layer, and wherein the free layer has an oxidation control layer (OCL) to prevent unwanted oxidation of boron in the free layer, and a magnetic moment tuning layer (MMTL) for tuning the saturation magnetization (Ms) value of the free layer thereby enabling a free layer thickness ≤10 Angstroms that provides substantial perpendicular magnetic anisotropy (PMA), better thermal stability, and lower switching voltage for spintronic applications than existing p-MTJ designs.

BACKGROUND

Magnetoresistive Random Access Memory (MRAM), based on the integration of silicon CMOS (complementary metal on semiconductor) with magnetic tunnel junction (MTJ) technology, is a major emerging technology that is highly competitive with existing semiconductor memories such as SRAM, DRAM, and Flash. Furthermore, spin-transfer torque (STT) magnetization switching described by J. Slonczewski in "Current driven excitation of magnetic multilayers", J. Magn. Magn. Mater. V 159, L1-L7 (1996), has stimulated considerable interest due to its potential application for spintronic devices such as STT-MRAM on a gigabit scale.

STT-MRAM is based on a p-MTJ element having a tunneling magneto-resistance (TMR) effect and wherein a stack of layers has a configuration in which two ferromagnetic (FM) layers are separated by a thin non-magnetic dielectric layer. One of the FM layers called the pinned layer (PL) has a magnetic moment that is pinned in a first direction while the other FM layer known as the free layer (FL) has a magnetic moment that is free to rotate in a direction parallel or anti-parallel to the first direction. Compared with conventional MRAM, STT-MRAM has an advantage in avoiding the half select problem associated with external magnetic fields generated by current carrying lines, and writing disturbance between adjacent cells. Magnetoresistive ratio (DRR)=$R_{AP}$–$R_P$/$R_P$ where $R_P$ and $R_{AP}$ are the resistance for the aforementioned parallel and anti-parallel states, respectively. It is important to have a DRR above 1 since the MR ratio is directly related to the read margin for the memory bit, or how easy it is to differentiate between the P state and AP state (0 or 1 bits).

The spin-transfer effect in STT-MRAM arises from the spin dependent electron transport properties of PL-spacer-FL multilayers. When a spin-polarized current traverses a magnetic multilayer in a current perpendicular to plane (CPP) direction, the spin angular moment of electrons incident on a FL interact with the magnetic moment of the FL near the interface between the FL and non-magnetic spacer that is typically a tunnel barrier layer. Through this interaction, the electrons transfer a portion of their angular momentum to the FL. As a result, spin-polarized current can switch the magnetization direction of the FL if the current density is sufficiently high, and if the dimensions of the multilayer are small.

Thermal requirements and low voltage switching in the dynamic regime are significant challenges for STT-MRAM in last level cache (LLC) applications. STT-MRAM is enabled by perpendicular magnetic anisotropy (PMA) MTJs (also called p-MTJs) that rely on interfacial perpendicular anisotropy produced at metal oxide/FL interfaces that are usually MgO/CoFeB or the like. To satisfy maximum process temperatures of 400° C. during a plurality of hours, it is essential that p-MTJs exhibit high thermal stability. Low switching voltages below 500 mV are equally important for the mass production of STT-MRAM for LLC applications operating in a precessional regime requiring reversal of FL magnetization at short pulse lengths below 10 ns, and at deep error rates of about 99.9%. At such short pulse lengths, thermally assisted switching is no longer viable.

When the free layer has a magnetization direction perpendicular to the plane of the film, the critical current ($i_C$) needed to switch the p-MTJ is directly proportional to the perpendicular anisotropy field as indicated in equation (1) where e is the electron charge, a is a Gilbert damping constant, Ms is the saturation magnetization of the free layer, h is the reduced Plank's constant, g is the gyromagnetic ratio, and $H_{k_{eff},\perp}$ is the out-of-plane anisotropy field of the magnetic region to switch, and V is the volume of the free layer:

$$i_c = \frac{\alpha e M s V H_{k_{eff},\perp}}{g\hbar} \quad (1)$$

The value $\Delta = kV/k_BT$ is a measure of the thermal stability of the p-MTJ where kV is also known as $E_b$ or the energy barrier between the parallel and anti-parallel magnetic states of the FL, $k_B$ is the Boltzmann constant and T is the temperature. Thermal stability is a function of the perpendicular anisotropy field as shown in equation (2):

$$\Delta = \frac{M_S V H_{k_{eff},\perp}}{2k_B T} \quad (2)$$

The perpendicular anisotropy field of the FL is expressed in equation (3) as:

$$H_{k_{eff},\perp} = -4\pi M_s + \frac{2K_U^{\perp,S}}{M_s d} + H_{k,\perp} \quad (3)$$

where $M_s$ is the saturation magnetization, d is the thickness of the FL, $H_{k,\perp}$ is the crystalline anisotropy field in the perpendicular direction, and $K_U^{\perp,S}$ is the surface perpendicular anisotropy of the top and bottom surfaces of the FL. The perpendicular anisotropy field of a magnetic layer (in the absence of strong crystalline anisotropy) is dominated by the shape anisotropy field ($-4\pi M_s$), on which little control is available. At a given thickness, lower Ms decreases shape anisotropy and the spin-polarized switching current but also decreases thermal stability, which is not desirable.

There are two distinct methods for achieving good FL thermal stability. One approach is to enhance surface perpendicular anisotropy $K_U^{\perp,S}$ by adding a second FL/metal oxide interface on an opposite side of the FL with respect to the tunnel barrier layer where the second metal oxide is often called a Hk enhancing layer. Accordingly, higher $E_b$ is realized. A second approach focuses on increasing the volume of the FL with the addition of non-magnetic insertion (NMI) metals such as Ta within the CoFeB free layer. The metal contributes to total FL thickness, and preserves PMA for thicker, higher magnetic moment sub-layers thereby raising $E_b$. Both methods for improving thermal stability are complementary and may be used simultaneously for greater $E_b$.

The presence of NMI material within the FL provides a method for tuning device functionality. A prominent effect of NMI material is a reduction in Ms. Our article "High-temperature thermal stability driven by magnetization dilution in CoFeB free layers for spin-transfer-torque magnetic random access memory", J. M. Iwata-Harms et al., Scientific Reports, V 8, 14409 (2018) demonstrates that increasing amounts of NMI metal inserted in the FL gradually reduces Ms and leads to increased variation in Ms over operating temperatures and a lowering of the demagnetizing field. NMI elements also play an important role in gettering elements including C, N, and O within the FL and the formation of carbides, nitrides, and oxides, respectively. The low atomic number (Z) elements are typically introduced into the FL during oxidation of the Hk enhancing layer, nitridation of the capping layer, and during FL sputter deposition due to oxygen content in the target, and their diffusion through the p-MTJ is exacerbated during high temperature processing. Gettering of the low Z elements preserves the quality of the CoFeB free layer and interfaces with the adjoining metal oxide layers.

Since increased FL volume is detrimental to switching in the precessional regime where switching current ($i_C$) is inversely proportional to pulse width, a new FL scheme for p-MTJs is needed where FL thickness is reduced for lower switching voltage while maintaining or improving p-MTJ properties such as magnetoresistive ratio (DRR), resistance×area (RA) product, and thermal stability.

SUMMARY

One objective of the present disclosure is to provide a p-MTJ with a free layer (FL) having a thickness ≤10 Angstroms and with sufficient PMA to provide thermal stability to 400° C. for a plurality of hours while enabling the p-MTJ to realize a high DRR of at least 1 and a resistance× area (RA) value less than 5 ohm-µm².

A second objective is to provide the FL and p-MTJ of the first objective such that the FL switches with a voltage less than 500 mV that is compatible in STT-MRAM with LLC applications.

According to one embodiment, these objectives are achieved by providing a p-MTJ comprised of a reference layer, tunnel barrier layer, and a FL with a first surface that interfaces with a first oxide layer (tunnel barrier layer), and a second surface that interfaces with a second oxide layer which is referred to as a Hk enhancing layer. A capping layer is typically the uppermost layer in the p-MTJ. FL regions proximate to the interfaces with the oxide layers exhibit substantial interfacial perpendicular anisotropy that enhance PMA in the FL.

A key feature is that the FL comprises both of an oxidation control layer (OCL) material and a magnetic moment tuning layer (MMTL) material. Each of the OCL and MMTL materials may be in the form of a continuous layer, a discontinuous layer, or as clusters or particles dispersed within the FL. The OCL material is used to protect the FL from undesirable oxidation of B that degrades the amorphous nature of as-deposited CoFeB, for example. The OCL material is preferably Mg and getters residual oxygen from the natural oxidation process of the Hk enhancing layer. In some p-MTJs, the OCL material also getters nitrogen that diffuses out of a nitride capping layer (NCL). Preservation of an amorphous CoFeB FL enables a higher quality FL due to delayed recrystallization at elevated process temperatures. The MMTL material serves to tune the FL Ms that affects thermal stability, switching voltage, and provides PMA at lower FL thicknesses compared with existing p-MTJ designs.

According to a first embodiment, there is a stack having an OCL/MMTL/OCL configuration formed between a first FL sub-layer (FL1) and a second FL sub-layer FL2 where FL1 interfaces with the tunnel barrier, and FL2 contacts the Hk enhancing layer. The OCL material is preferably Mg, a Mg alloy, Ba, or Ca with a thickness of 0.5 Angstrom to 10 Angstroms, and the MMTL material has a thickness of 0.25-1.0 Angstrom and is one or more of Nb, Mo, Ta, W, Re, Ti, V, Cr, Zr, Hf, Ru, Rh, Os, Ir, Cu, Zn, Pt, Au, Ag, Pd, Al, B, Ga, Si, and Ge. Each of FL1 and FL2 is a single layer or multilayer of one or more of Co, Fe, CoFe, CoFeB, CoB, FeB, CoFeNi, or CoFeNiB. Optionally, one or both of FL1 and FL2 is a Heusler alloy including $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. In other embodiments, one or both of FL1 and FL2 is an ordered $L1_0$ or $L1_1$ material such as MnAl, MnGa, and RT wherein R is Rh, Pd, Pt, Ir, or an alloy thereof, and T is Fe, Co, Ni or an alloy thereof. In yet another embodiment, one or both of FL1 and FL2 is a rare-earth alloy including but not limited to TbFeCo, GdCoFe, FeNdB, and SmCo.

In second and third embodiments, a MMTL/OCL and an OCL/MMTL stack, respectively, is formed between FL1 and FL2. According to a fourth embodiment, one of the OCL and MMTL materials is formed within FL2 while the other is between FL1 and FL2. In the fifth embodiment, one of the OCL and MMTL materials is formed within FL1 while the other is between FL1 and FL2. In the first through fifth embodiments, each of FL1, OCL, MMTL, and FL2 are sputter deposited in a separate step.

The present disclosure also anticipates a sixth embodiment where FL1 and FL2 are each co-sputtered with an OCL material such that the OCL is dispersed as clusters or particles within FL1 and FL2. The MMTL material is deposited as a separate layer between FL1 and FL2.

According to a seventh embodiment, both of the OCL and MMTL materials are co-sputtered with FL1 and FL2. The OCL material is also deposited as a separate layer between FL1 and FL2.

An eighth embodiment features a plurality of MMTL particles or clusters formed within at least FL2 and, in some cases, within FL2 and an OCL that is between FL1 and FL2. Here, MMTL material may be ion implanted into a FL1/OCL/FL2 stack, or an intermediate stack that is FL1/OCL/FL2/MMTL may be formed and then an annealing process, for example, causes diffusion of MMTL into at least FL2. In all embodiments, FL1 has thickness t1 and FL2 has thickness t2 where t1+t2 is preferably ≤10 Angstroms.

BRIEF DESCRIPTION OF THE DRAWINGS

FIG. 11A shows a resistance vs. field loop for a p-MTJ with no metal insertion in a FL while

FIG. 14 is a table listing the free energy of oxide formation for various elements.

DETAILED DESCRIPTION

Figure 1:
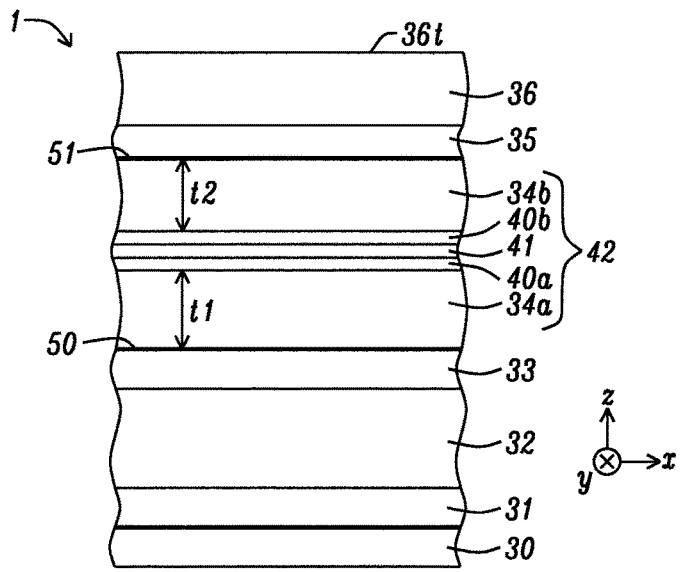
FIG. 1 is a cross-sectional view showing a p-MTJ wherein a MMTL material is formed between two OCL materials, and the bottom OCL material contacts a first free layer (FL1) and the top OCL material adjoins a second free layer (FL2) according to a first embodiment of the present disclosure.

The present disclosure is a p-MTJ wherein an OCL material and a MMTL material are formed within a free layer to provide a switching voltage substantially less than 500 mV while maintaining a DRR of at least 1, a RA product <5 ohm-$\mu m^2$, and thermal stability to 400° C. in a STT-MRAM for LLC applications. Although the exemplary embodiments depict p-MTJ stacks with bottom spin valve configurations, the present disclosure also encompasses a p-MTJ having a top spin valve configuration or a dual spin valve structure as appreciated by those skilled in the art. The p-MTJ may be incorporated in a MRAM, STT-MRAM, spin orbit torque (SOT)-MRAM, and other spintronic devices such as a spin torque oscillator, Spin Hall Effect device, magnetic sensor, or a biosensor. The p-MTJ layers in the drawings are not necessary drawn to size. In particular, the FL may appear thicker than the pinned layer in order to clearly show multiple sub-layers therein. Unless otherwise specified, an OCL material or MMTL material may be in the form of a continuous layer, discontinuous layer, cluster or particles. The term "OCL" may be used interchangeably with "OCL material", and "MMTL" may be used interchangeably with "MMTL material".

Previously, we have disclosed various methods of improving magnetic properties in a p-MTJ that involve modification of the FL. In related U.S. Pat. No. 8,592,927, one or more elements including Mg and Ta are inserted as a moment diluting layer between FL1 and FL2 to reduce the perpendicular demagnetizing field, lower the RA product, and yield higher thermal stability. Similarly, in related U.S. Pat. No. 8,710,603, one or more glassing agents are formed within a middle portion of the FL so that the crystallizing temperature is greater than the annealing temperature for a desired result of higher thermal stability. Related U.S. Pat. No. 9,966,529 discloses that formation of metal oxide clusters or a discontinuous metal oxide layer within the FL is advantageous in enhancing PMA and thermal stability while maintaining RA at an acceptable level.

Now we have discovered a further improvement in p-MTJ performance that is designed for spintronic devices such as STT-MRAM where a low switching voltage is critical in addition to maintaining other acceptable properties including DRR, RA product, and thermal stability. Improved p-MTJ performance is realized by including a MMTL material such as Mo or W and an OCL material that is preferably Mg within a FL. In the first through third embodiments and sixth through eighth embodiments, the MMTL and OCL materials form at least one interface with each other. In other embodiments, the MMTL and OCL materials are separated by a portion of the FL and do not contact each other. In all embodiments, we observe that an OCL layer in the FL enables FL PMA to be realized at thicknesses as low as 7 Angstroms compared with p-MTJs without an OCL insertion layer where FL PMA is only achieved at FL thickness ≥11 Angstroms. Accordingly, lower switching voltage is achieved with a FL having a thickness in the range of 7-10 Angstroms and with substantial PMA.

Referring to FIG. 1, a first embodiment of the present disclosure is depicted where a p-MTJ 1 is formed on a substrate 30 that is a bottom electrode, for example, and has a stack of layers wherein an optional seed layer 31, pinned layer 32, tunnel barrier layer 33, FL 42, Hk enhancing layer 35, and a capping layer 36 are sequentially formed on the substrate. The FL is a stack wherein FL1 34a, first OCL 40a, MMTL 41, second OCL 40b, and FL2 34b are sequentially formed on the tunnel barrier layer. Thus, FL1 forms a first interface 50 with the tunnel barrier while FL2 has a second interface 51 with the Hk enhancing layer so that PMA within FL1 and FL2, respectively, is enhanced. Both of the first and second OCL form interfaces with the MMTL. Although the exemplary embodiment features a bottom spin valve configuration, those skilled in the art will appreciate that the stacking order of layers 32 through 35 may be reversed to yield a top spin valve configuration.

Seed layer 31 is typically a single layer or multilayer made of one or more metals or alloys that promote a uniform thickness in overlying layers. When the reference layer 32 has PMA, a seed layer is chosen that also enhances PMA in the reference layer. In some embodiments, the reference layer is a single magnetic layer that is one or more of Co and Fe that may be alloyed with one or both of B and Ni. Alternatively, the reference layer may have a synthetic antiferromagnetic (SyAF) configuration represented by AP2/coupling layer/AP1 where AP2 is a first magnetic layer on the seed layer, or formed on an optional antiferromagnetic (AFM) layer (not shown), and AP1 is a second magnetic layer that is antiferromagnetically (AF) coupled to AP2 through a metal AF coupling layer that is Ru or the like. In other embodiments, the reference layer, or one or both of AP2 and AP1 in a SyAF configuration is a laminated stack of layers such as $(Co/Ni)_n$, $(CoFe/Ni)_n$, $(CoFe/NiCo)_n$, $(CoFe/NiFe)_n$, or the like having inherent PMA and where n is an integer representing the lamination number. There may be a transition layer (not shown) that is one of Co, Fe, CoFe, and CoFeB between the uppermost layer in the laminated stack and the tunnel barrier layer 33.

In a preferred embodiment, tunnel barrier layer 33 is MgO that is formed by sputter depositing a MgO target, or by depositing one or more Mg layers and then oxidizing one or more Mg layers with a known radical oxidation (ROX) or natural oxidation (NOX) method. However, other metal oxides, metal nitrides, or metal oxynitrides known in the art may be employed with or instead of MgO. It should be understood that the interface of a MgO layer with a magnetic layer that is CoFeB, for example, provides higher interfacial perpendicular anisotropy and a greater magnitude of PMA in the magnetic layer than an interface with other metal oxides.

One or both of FL1 34a and FL2 34b is a single layer or multilayer of one or more of Co, Fe, CoFe, CoFeB, CoB, FeB, CoFeNi, or CoFeNiB. Optionally, one or both of FL1 and FL2 is a Heusler alloy including $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. In other embodiments, one or both of FL1 and FL2 is an ordered $L1_0$ or $L1_1$ material such as MnAl, MnGa, and RT wherein R is Rh, Pd, Pt, Ir, or an alloy thereof, and T is Fe, Co, Ni or an alloy thereof. In yet another embodiment, one or both of FL1 and FL2 is a rare-earth alloy including but not limited to TbFeCo, GdCoFe, FeNdB, and SmCo. FL1 has a thickness t1, and FL2 has a thickness t2 where t1+t2 is preferably from 5 Angstroms to 12 Angstroms.

Each of OCL 40a, 40b is preferably Mg with a thickness up to 6 Angstroms, and where the thickness of OCL 40a+ thickness of OCL 40b is preferably ≤10 Angstroms. However, in other embodiments, the OCL may be a Mg alloy or an element such as Ca or Ba with a low free energy of oxide formation proximate to that of Mg in FIG. 14. MMTL 41 is one or more of Nb, Mo, Ta, W, Re, Ti, V, Cr, Zr, Hf, Ru, Rh, Os, Ir, Cu, Zn, Pt, Au, Ag, Pd, Al, B, Ga, Si, and Ge, and preferably has a thickness from 0.25 Angstroms to 1.0 Angstroms. All sub-layers in FL 42 are sputter deposited in succession. It should be understood that when sputtering a MMTL material having a high atomic number (Z number) on an OCL that is Mg with a relatively low Z number, an upper portion of the OCL may be resputtered and co-deposited with the MMTL. Accordingly, the present disclosure anticipates that in embodiments where a MMTL is deposited on an OCL, an intermediate layer (not shown) may be formed between the OCL and MMTL that is comprised of both OCL and MMTL elements.

The Hk enhancing layer 35 is made of a material that provides interfacial perpendicular anisotropy at interface 51 by contacting a surface of the free layer. According to one preferred embodiment, the Hk enhancing layer is comprised of MgO having a thickness and oxidation state that are controlled to give a resistance×area (RA) product smaller than that of the MgO layer in the tunnel barrier layer 33 in order to minimize a total RA ($RA_{TOTAL}$) product for the p-MTJ, and avoid a significant decrease in the DRR. In an alternative embodiment, the Hk enhancing layer may be an oxide or oxynitride comprised of one or more of Si, Sr, Ti, Ba, Ca, La, Al, Mn, V, and Hf. Moreover, the Hk enhancing layer may be embedded with conductive particles made of one or more of Fe, Co, Ni, Ru, Cr, Au, Ag, and Cu to lower the resistivity therein. For instance, the conductive particles may be 20% to 45% by weight of the Hk enhancing layer.

The Hk enhancing layer is formed by first depositing one or more of the aforementioned metals on the FL, and then performing a well known natural oxidation or oxynitridation. The Hk enhancing layer may have a stoichiometric or non-stoichiometric oxygen content where stoichiometric is defined as a condition where essentially all vacant sites in a metal lattice are occupied by oxygen atoms in a metal oxide layer. A non-stoichiometric oxygen content in the Hk enhancing layer means that a certain number of sites in the metal oxide lattice remain vacant or are filled with other atoms such as N.

The uppermost layer in p-MTJ 1 is capping layer 36 that may comprise one or both of Ru and Ta. In other embodiments, the capping layer may comprise a metal nitride (MN) or metal oxynitride (MON) where M is one or more of Ti, V, Cr, Zr, Nb, Mo, Hf, Ta, W, and Si. There may also be a buffer layer (not shown) that is an M layer between the Hk enhancing layer and the MN or MON capping layer (also referred to as a nitride capping layer or NCL) to prevent nitride diffusion from the NCL to the Hk enhancing layer 35 and FL 42.

One key feature of the present disclosure is the oxygen scavenging aspect of the OCL 40a, 40b. In particular, the OCL getters loosely bound oxygen from the Hk enhancing layer 35. We have found that oxidation of a metal layer to form the Hk enhancing layer is difficult to control. Ideally, a stoichiometric oxidation state in the Hk enhancing layer is desirable to generate a maximum amount of interfacial perpendicular anisotropy at interface 51. Unfortunately, in doing so, there is generally a significant volume of loosely bound oxygen within the Hk enhancing layer that tends to diffuse into the free layer during subsequent processing. By including an OCL within the free layer, the excess oxygen is substantially less likely to oxidize the free layer since there is a greater driving force for the oxygen to react with Mg than with Co or Fe as indicated in FIG. 14. Accordingly, DRR is preserved with the avoidance of undesirable side reactions in which portions of the free layer become "dead zones" where magnetic properties are destroyed by oxidation. In some embodiments, an OCL may also getter nitrogen that diffuses out of a NCL thereby preventing formation of CoN, FeN, or BN and degradation of DRR and PMA in FL 42.

Although not bound by theory, it is believed that portions of the OCL that getter oxygen thereby form metal oxide sites that provide additional metal oxide/FL interfaces to further enhance PMA by contributing to the $K_U^{1,S}$ component in equation (3) described earlier.

Note that the total RA product for p-MTJ 1 is determined by a contribution from each of the oxide layers and is represented by the equation $RA_{TOTAL} = (RA_{33} + RA_{35})$ where $RA_{33}$ and $RA_{35}$ are the resistance×area product for the tunnel barrier layer, and Hk enhancing layer, respectively. In some embodiments, the Hk enhancing layer has a non-stoichiometric oxygen content in order to minimize $RA_{35}$ such that $RA_{TOTAL} < 5$ ohm-μm$^2$ for optimum MTJ performance.

MMTL enables a reduction in t1 and t2 for FL1 34a and FL2 34b, respectively. A thinner FL is responsible for lower switching voltages and faster switching times. As mentioned earlier, increasing the MMTL content/thickness provides a reduction in Ms for FL 42. However, there is a trade-off in that as MMTL content increases, there is a greater risk of Ms variation within the FL at elevated temperatures.

As described in a later section, p-MTJ 1 provides the advantage of a 10 ns writing voltage <500 mV with a 1 ppm defect rate for a CoFeB FL thickness ≤10 Angstroms. Moreover, DRR is maintained above 1, and RA product is <5 ohm-μm$^2$ for an overall performance that is improved over existing STT-MRAM designs.

Figure 2:
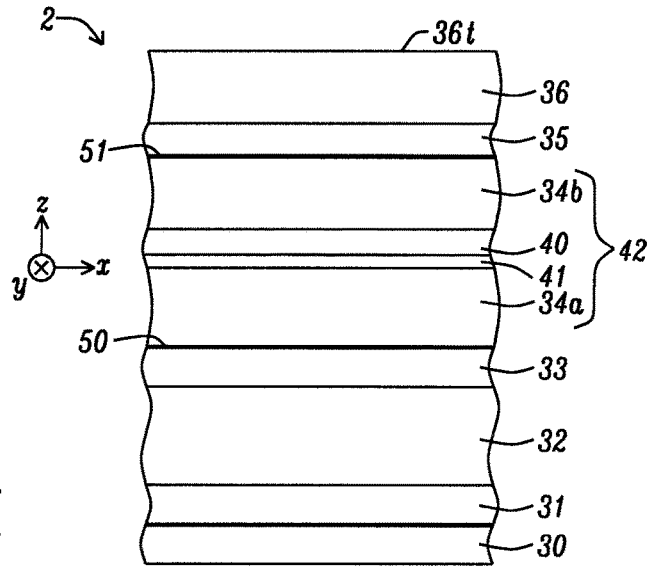
FIG. 2 is a cross-sectional view of a p-MTJ wherein a stack having a lower MMTL material and upper OCL material is formed between FL1 and FL2 according to a second embodiment of the present disclosure.

According to a second embodiment shown in FIG. 2, p-MTJ 2 retains all the features of the first embodiment, except the OCL below MMTL 41 is omitted so there is a single OCL 40 that is formed on the MMTL. Here, the MMTL is formed on FL1 34a and the OCL contacts a bottom surface of FL2 34b to yield a FL1/MMTL/OCL/FL2 configuration for FL 42. All the advantages realized with the first embodiment are also found in p-MTJ 2.

Figure 3:
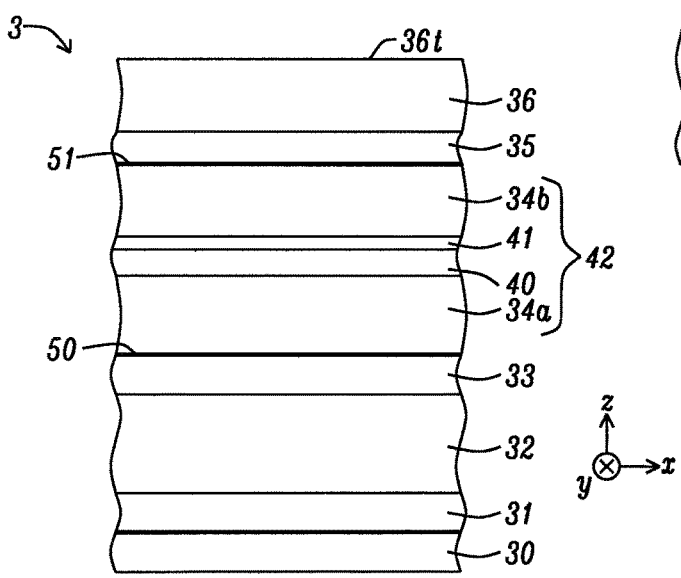
FIG. 3 is a cross-sectional view of a p-MTJ in which a stack having a lower OCL material and an upper MMTL material is formed between FL1 and FL2 according to a third embodiment of the present disclosure.

A third embodiment of the present disclosure is illustrated in FIG. 3 where p-MTJ 3 retains all the features of the first embodiment, except the OCL above the MMTL 41 is omitted so there is a single OCL 40 that is formed on FL1 34a. Here, the MMTL contacts a bottom surface of FL2 34b to yield a FL1/OCL/MMTL/FL2 configuration for FL 42. All the advantages associated with the first embodiment are also realized with p-MTJ 3.

Figure 4A:
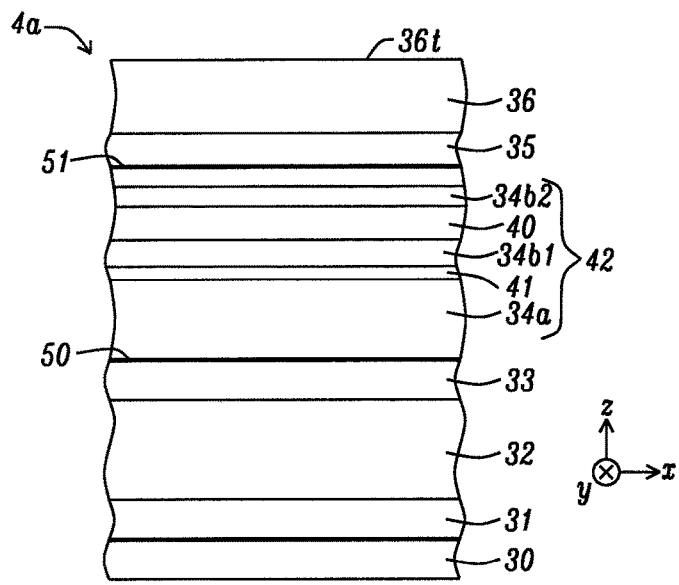
FIG. 4A is a cross-sectional view of a p-MTJ wherein a MMTL material is formed between FL1 and FL2 while an OCL material is within FL2 according to a fourth embodiment of the present disclosure.
Figure 4B:
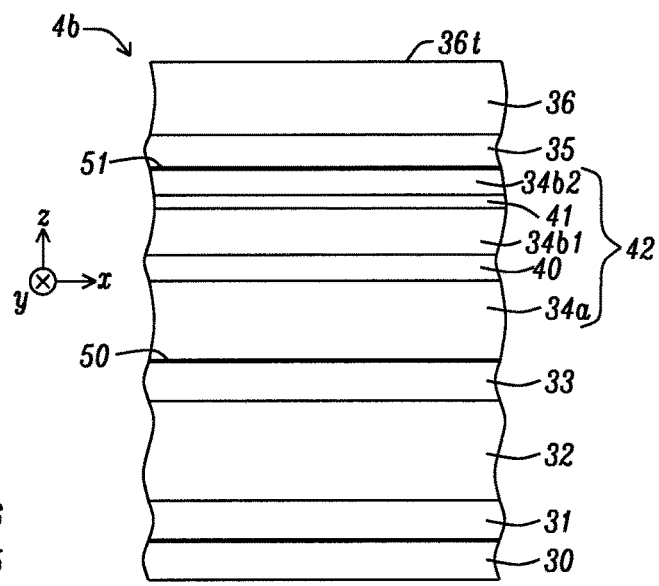
FIG. 4B is a cross-sectional view of a p-MTJ wherein an OCL material is formed between FL1 and FL2 while a MMTL material is within FL2 according to a fourth embodiment of the present disclosure.

A fourth embodiment is depicted in FIG. 4A where MTJ 4a retains the same layers as in the previous embodiment except OCL 40 and MMTL 41 are separated by a FL2 sub-layer 34b1. Thus, the present disclosure anticipates that when the MMTL is formed between FL1 34a and FL2 as in previous embodiments, the OCL may be moved within FL2 and is sandwiched between lower FL2 sub-layer 34b1 and upper FL2 sub-layer 34b2. Alternatively, as shown in FIG. 4B, the positions of the OCL and MMTL may be switched such that the OCL is between the FL1 and the lower FL2 sub-layer while the MMTL is sandwiched between the lower and upper FL2 sub-layers.

Figure 5A:
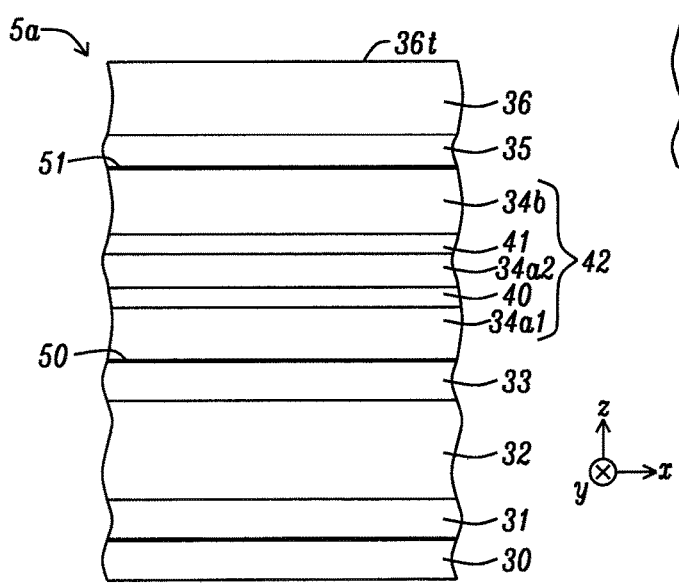
FIG. 5A is a cross-sectional view of a p-MTJ wherein a MMTL material is formed between FL1 and FL2 while an OCL material is within FL1 according to a fifth embodiment of the present disclosure.
Figure 5B:
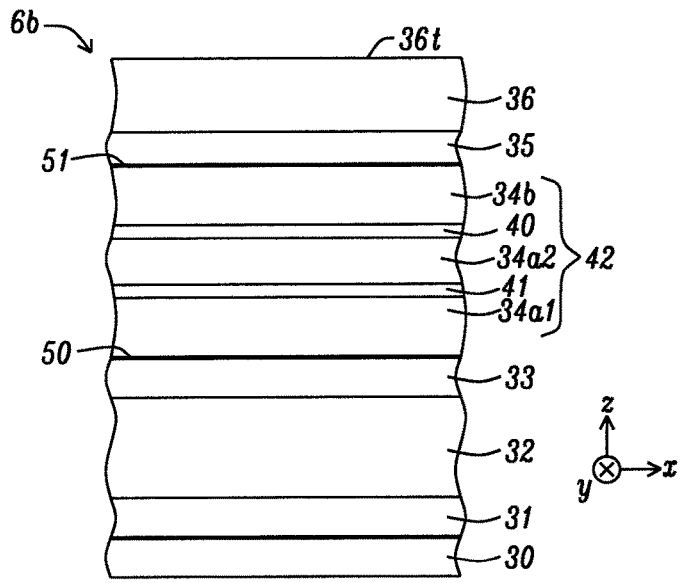
FIG. 5B is a cross-sectional view of a p-MTJ wherein an OCL material is formed between FL1 and FL2 while a MMTL material is within FL1 according to a fifth embodiment of the present disclosure.

As shown in FIG. 5A, the present disclosure also encompasses a fifth embodiment shown as p-MTJ 5a where the layers in FL 42 are retained from the fourth embodiment in FIG. 4A except the OCL 40 is moved to a position between a lower FL1 sub-layer 34a1 and an upper FL1 sub-layer 34a2. Meanwhile, the MMTL continues to be formed between FL1 and FL2 34b. Alternatively, the positions of the OCL and MMTL may be switched as shown in FIG. 5B with p-MTJ 5b wherein the OCL is between the FL1 and FL2 layers, and the MMTL is sandwiched between the lower and upper FL1 sub-layers.

Figure 6:
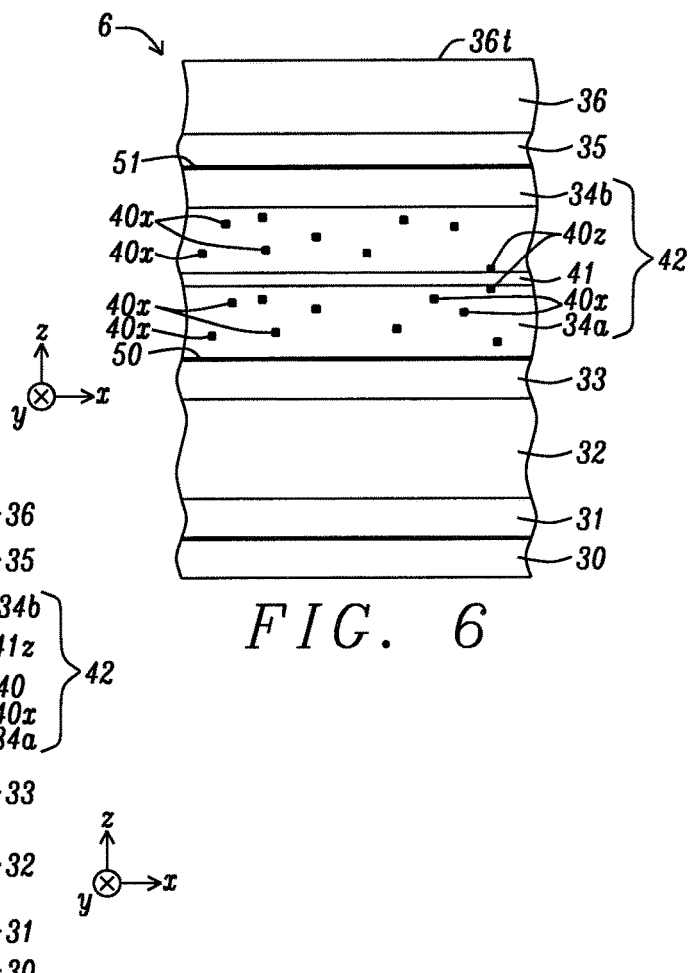
FIG. 6 is a cross-sectional view of a p-MTJ wherein an OCL material is formed within FL1 and FL2, and a MMTL material is formed between FL1 and FL2 according to a sixth embodiment of the present disclosure.

According to a sixth embodiment of the present disclosure depicted as p-MTJ 6 in FIG. 6, the OCL may be co-sputtered with FL1 34a and with FL2 34b such that the OCL is dispersed in each of FL1 and FL2 as particles or clusters 40x. In some embodiments, the OCL may form an alloy (not shown) with FL1 and FL2 to give an alloy such as CoFeBMg when CoFeB and Mg are used for the FL and OCL, respectively. Note that the MMTL 41 may be sputter deposited between the FL1+OCL and FL2+OCL depositions to give a trilayer stack for FL 42. The present disclosure anticipates that a number of OCL particles or clusters 40z will contact or interface with the MMTL. All other layers in the p-MTJ are retained from previous embodiments.

Figure 7:
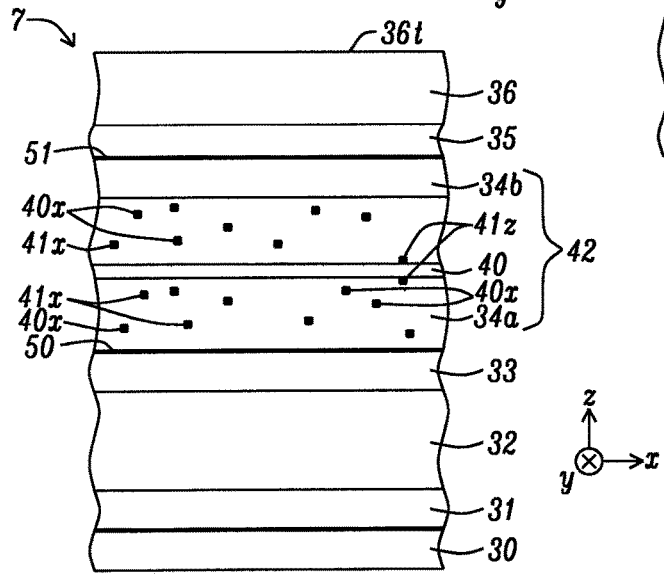
FIG. 7 is a cross-sectional view of a p-MTJ wherein OCL and MMTL materials are formed within FL1 and FL2, and an OCL material is formed between FL1 and FL2 according to a seventh embodiment of the present disclosure.

There is also a seventh embodiment of the present disclosure shown as p-MTJ 7 in FIG. 7 where the sixth embodiment is modified to also include MMTL in a co-sputtering deposition with the OCL and FL1, and again with the OCL and FL2. In this case, each of the OCL and MMTL may form particles or clusters 40x and 41x, respectively in FL1 34a and FL2 34b. Optionally, one or both of the OCL and MMTL may form an alloy with each of FL1 and FL2. Furthermore, an OCL 40 may be deposited between the FL1+OCL+MMTL and FL2+OCL+MMTL depositions to yield a trilayer stack for FL 42. There may be a number of MMTL particles or clusters 41z that contact or interface with OCL 40.

Since current analytical techniques are unable to determine the exact distribution of metal particles or clusters within a magnetic film, the present disclosure anticipates that OCL and/or MMTL particles and clusters may be substantially uniformly dispersed within FL1 and FL2. On the other hand, depending on the deposition conditions, the particles or clusters may have a greater concentration in portions of FL1 34a and FL2 34b proximate to the center of FL 42 than in regions adjacent to interfaces 50, 51.

Figure 8:
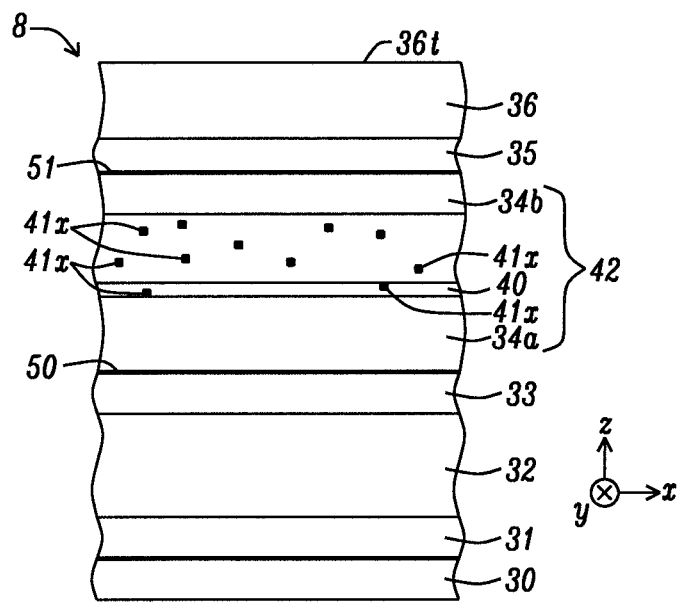
FIG. 8 is a cross-sectional view of a p-MTJ having an OCL material formed between FL1 and FL2, and a MMTL material implanted into at least FL2 and the OCL according to an eighth embodiment of the present disclosure.

According to an eighth embodiment depicted as p-MTJ 8 in FIG. 8, the present disclosure encompasses a process flow where an intermediate FL structure (not shown) is formed by sequentially depositing FL1 34a, OCL 40, and FL2 34b to give a trilayer stack. Thereafter, the MMTL may be ion implanted to yield particles 41x at least in FL2, and optionally in the OCL depending on the ion implant energy and the FL2 thickness. In another embodiment, a MMTL is deposited on the FL1/OCL/FL2 intermediate FL stack (not shown) and then an annealing step causes the MMTL to diffuse into FL2 and optionally into the OCL as shown in p-MTJ 8. The annealing step may occur after all layers in the p-MTJ are formed and the p-MTJ stack is patterned to provide an array of p-MTJ cells on substrate 30.

Figure 9:
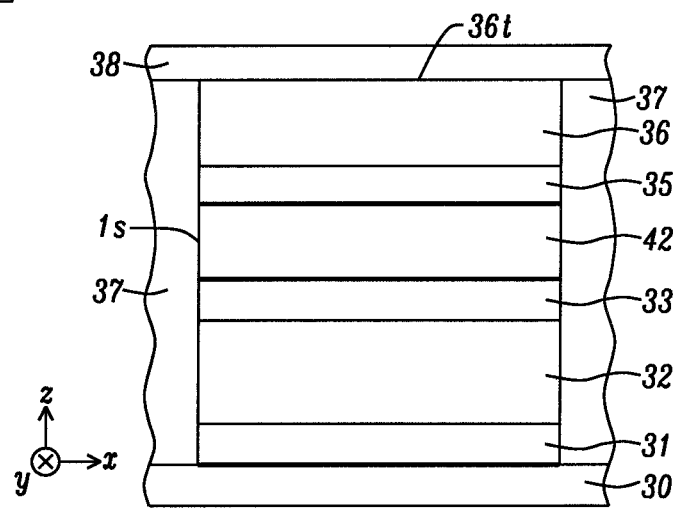
FIG. 9 is a cross-sectional view of a patterned p-MTJ with a sidewall, and where an encapsulation layer adjoins the sidewall to electrically insulate the p-MTJ from adjacent p-MTJs according to an embodiment of the present disclosure.

Referring to FIG. 9, p-MTJ 1 is illustrated after a well known photolithography patterning and etching sequence is followed to form sidewall 1s. Thereafter, insulation layer 37 is deposited and electrically isolates the p-MTJ from adjacent p-MTJs (not shown) in an array formed as a result of the patterning and etching sequence. A chemical mechanical polish (CMP) process is typically employed to form a smooth surface of the insulation layer 37 that becomes coplanar with a top surface of the p-MTJs in the array. Finally, a top electrode layer comprised of a plurality of parallel lines including top electrode 38 is formed on the insulation layer and on the p-MTJs.

Figure 10:
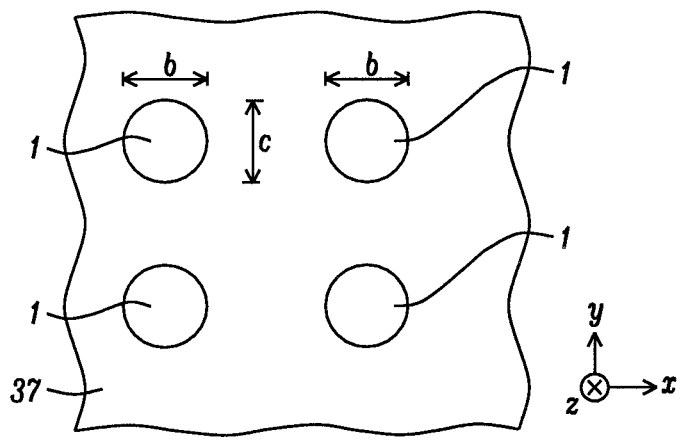
FIG. 10 shows a top-down view of a plurality of p-MTJs that are formed in rows and columns, and separated by an encapsulation layer according to an embodiment of the present disclosure.

FIG. 10 is a top-down view with the top electrode layer removed and shows a plurality of p-MTJs 1 in an array of rows and columns and separated by encapsulation layer 37. In the exemplary embodiment, each p-MTJ has a circular shape having a width b and length c where b=c. In other embodiments (not shown), the p-MTJs may be in the shape of an oval or a polygon where b is unequal to c. It should be understood that any of the p-MTJs in the second through eighth embodiments may be substituted for p-MTJ 1.

All layers in the embodiments illustrated in FIGS. 1-8 may be formed in an Anelva C-7100 thin film sputtering system or the like which typically includes three physical vapor deposition (PVD) chambers each having five targets, an oxidation chamber, and a sputter etching chamber. Usually, the sputter deposition process comprises a noble gas such as argon, and oxygen is excluded unless required for tunnel barrier or Hk enhancing layer formation in the oxidation chamber. Once all layers in the p-MTJ stack are laid down on the bottom electrode, and optionally during or after the encapsulation layer deposition described previously, a high temperature annealing may be performed in a vacuum oven for 1 to 5 hours at a temperature of about 360° C. to 400° C.

Figure 11A:
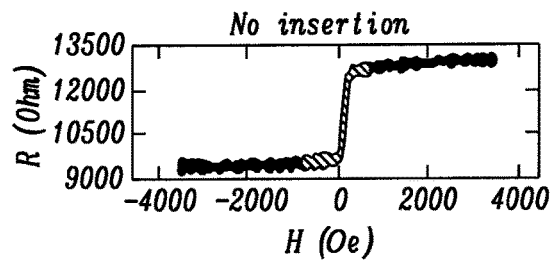

Referring to FIG. 11A, resistance vs. H field (R vs. H) measurements are illustrated for approximately 30 nm circular STT-MRAM devices wherein p-MTJs having a stack with a seed layer, synthetic antiferromagnetic pinned layer, MgO tunnel barrier, CoFeB FL, MgO Hk enhancing layer, and a nitride capping layer are sequentially formed on a substrate. The CoFeB FL has a thickness between 7-10 Angstroms and with no metal (OCL or MMTL) insertion. This p-MTJ serves as a Reference for subsequent measurements and we observe there is an onset of PMA in the resistance vs. field loop.

Figure 11B:
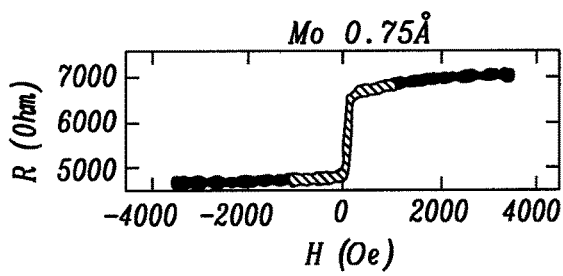
FIGS. 11B, 11D, 11F show resistance vs. field loops for various MMTL materials in the FL.
Figure 11C:
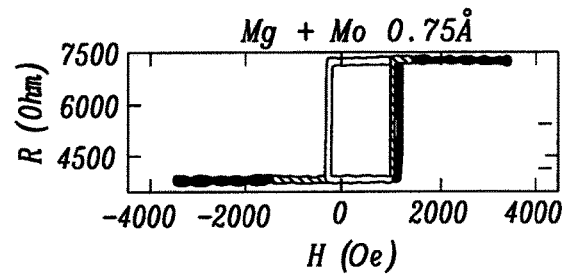
FIGS. 11C, 11E, and 11G depict resistance vs. field loops when Mg is added to a Mo, W, or Ta MMTL material within the FL.
Figure 11D:
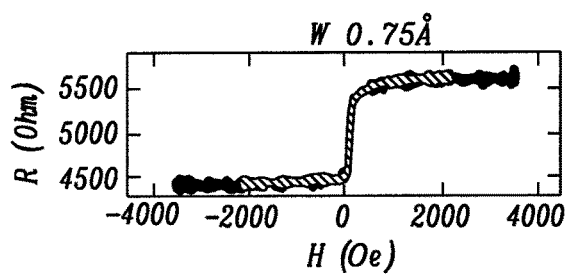
Figure 11E:
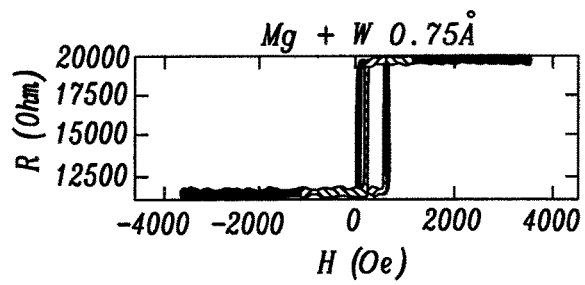
Figure 11F:
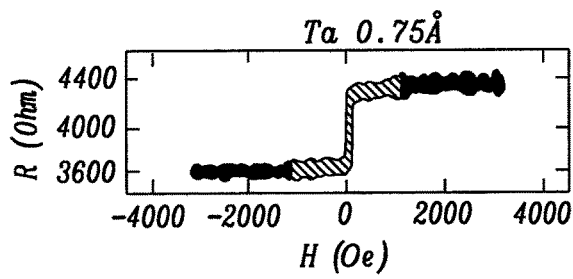
Figure 11G:
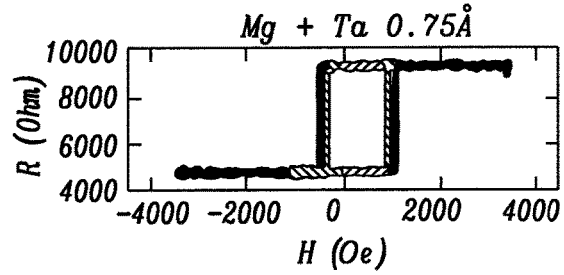

In FIGS. 11B, 11D, 11F, a 0.75 Angstrom thick MMTL comprised of Mo, W, and Ta, respectively, is inserted in the FL. There is essentially no effect on FL PMA since the R vs. H loops are identical to the result in FIG. 11A. However, as found in FIGS. 11C, 11E, and 11G, when a 4 Angstrom thick Mg (OCL) is added to the FL with a Mo, W, and Ta MMTL, respectively, according to the first embodiment (p-MTJ 1 in FIG. 1), there is a dramatic improvement in PMA with an improved coercive field (Hc) and sharp switching. The enhancement in FL PMA with the addition of Mg is also manifested in the anisotropy field Hk, and encompasses all MMTL materials listed previously including noble metals such as Pt, and semi-metallic metals such as Si.

Figure 12:
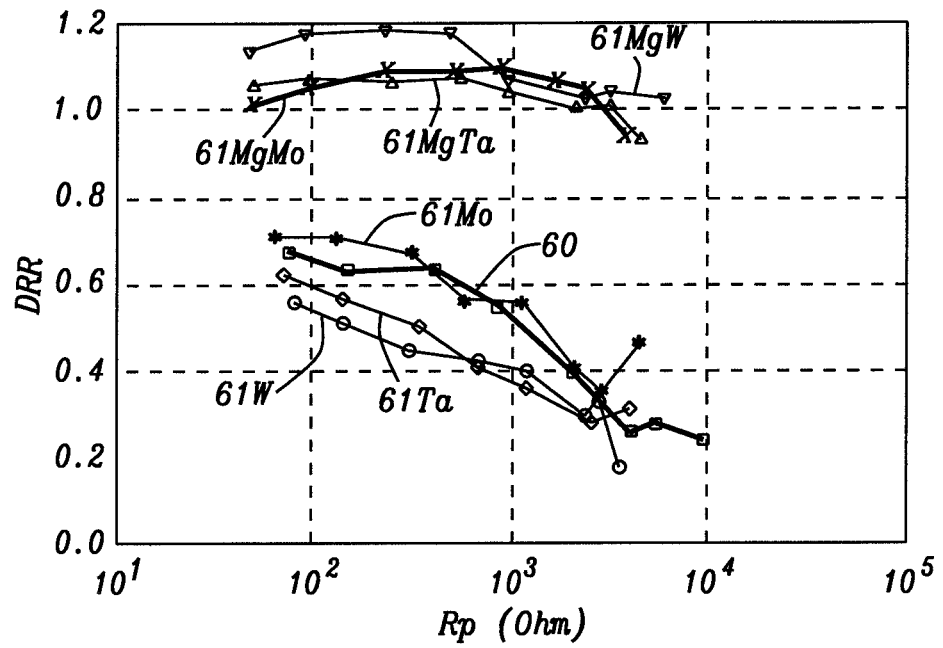
FIG. 12 is a plot of DRR vs. Rp for various p-MTJs having a MMTL material in the FL, and a second group of p-MTJs having a MMTL material in addition to an OCL material (Mg) in the FL according to an embodiment of the present disclosure.

In FIG. 12, DRR vs. Rp (Ohms) is plotted for the examples previously described with regard to FIGS. 11A-11G. A Rp of $10^4$ indicates the smallest p-MTJ size of about 30 nm in the study while a Rp of $10^3$ corresponds to a p-MTJ size proximate to 100 nm, and the lowest Rp corresponds to a p-MTJ size of about 300 nm. Curve 60 is the result of no OCL or MMTL insertion in the CoFeB FL while curves 61Mo, 61W, and 61Ta relate to the 0.75 Angstrom MMTL insertion of Mo (FIG. 11B), W (FIG. 11D), and Ta (FIG. 11F), respectively, in the FL. All of the aforementioned p-MTJ samples exhibit a DRR of 0.7 or below, which is unacceptable performance for advanced spintronic devices. However, practically all data points on curves 61MgMo, 61MgW, and 61MgTa (corresponding to the p-MTJ samples in FIG. 11C, FIG. 11E, and FIG. 11G, respectively) exhibit a DRR of at least 1 that satisfies the objective of this disclosure.

Figure 13:
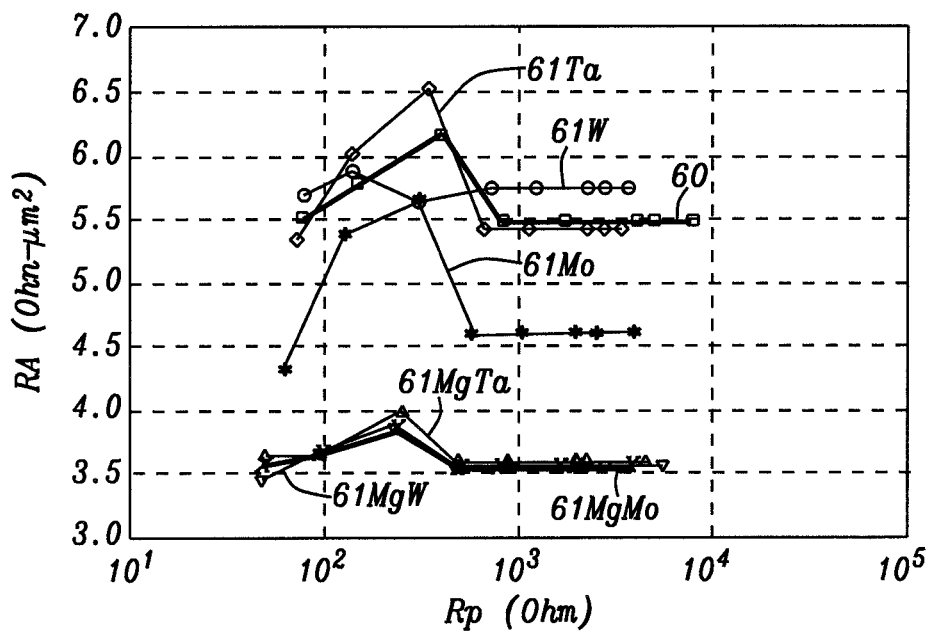
FIG. 13 is a plot of RA vs. Rp for various p-MTJs having a MMTL material in the FL, and a second group of p-MTJs having a MMTL material in addition to Mg in the FL according to an embodiment of the present disclosure.

Referring to FIG. 13, RA vs. Rp is plotted for the aforementioned p-MTJ examples. Curves 60, 61W, and 61Ta all have a RA product >5 Ohm-µm² while most data points on the 61Mo curve are slightly below the desired RA target of 5 Ohm-µm². We observe that all data points on the 61MgMo, 61MgW, and 61MgTa curves are at or below a RA of 4 Ohm-µm² thereby meeting the RA product objective of the present disclosure.

Since there is no PMA in the Reference sample, switching voltage cannot be determined. However, when a Mg layer is inserted in a CoFeB FL having a thickness from 7-10 Angstroms, switching voltage is about 200 mV for a 10 ns pulse length and with a defect rate of 1 ppm that is measured at 25° C. When a MMTL is added to the OCL in the FL according to the first embodiment in FIG. 1, switching voltage is somewhat higher than 200 mV, but still well below the 500 mV objective.

The methods of depositing a FL 42 according to the first through eighth embodiments may be summarized as follows. There may be a layer-by-layer sputter deposition of FL1, the MMTL and then the OCL (or OCL and then the MMTL), and finally FL2 to provide the FL stacks in the second and third embodiments, respectively. Optionally, a first OCL, the MMTL, and the second OCL are deposited between FL1 and FL2 according to the first embodiment. In other embodiments, the process of the second embodiment is modified to deposit a first FL2 sub-layer on the MMTL before depositing the OCL, and then the second FL2 sub-layer, or the process of the third embodiment is modified to deposit a first FL2 sub-layer on the OCL before depositing the MMTL and then the second FL2 sub-layer. Another process flow involves depositing one of the MMTL and OCL between first and second FL1 sub-layers before depositing the other of the MMTL and OCL followed by FL2.

Another process flow comprises co-sputtering the OCL with each of FL1 and FL2, and an intermediate step of depositing a MMTL between the FL1+OCL and FL2+OCL depositions. Optionally, both of the OCL and MMTL are co-sputtered with FL1 and FL2, and there is an intermediate step of depositing an OCL between the FL1+OCL+MMTL and FL2+OCL+MMTL deposition steps.

Finally, according to the eighth embodiment, a MMTL may be driven into at least the FL2 in a FL1/OCL/FL2 stack using an ion implantation method. In an alternative pathway, a MMTL layer is deposited on a top surface of FL2 in the FL1/OCL/FL2 stack, and is subsequently driven into at least the FL2 by employing an anneal process.

All of the embodiments described herein may be incorporated in a manufacturing scheme with standard tools and processes. A substantial reduction in switching voltage is achieved by enabling a FL with a thickness ≤10 Angstroms to have sufficient PMA while maintaining other performance characteristics such as DRR>1, $RA_{TOTAL}$ product ≤5 Ohm-µm², and thermal stability to 400° C. over a plurality of hours, which are important advantages in enabling advanced STT-MRAM, and related spintronic devices to be competitive with alternative devices.

While the present disclosure has been particularly shown and described with reference to, the preferred embodiments thereof, it will be understood by those skilled in the art that various changes in form and details may be made without departing from the spirit and scope of this disclosure.

We claim:

1. A perpendicular magnetic tunnel junction (p-MTJ), comprising:
    (a) a tunnel barrier layer that is a first metal oxide layer;
    (b) a Hk enhancing layer that is a second metal oxide layer or a metal oxynitride layer;
    (c) a free layer (FL) with a first surface that forms a first interface with the tunnel barrier layer, a second surface that forms a second interface with the Hk enhancing layer, wherein the FL consists of:
        (1) one or more unoxidized magnetic materials;
        (2) an oxidation control layer (OCL) material that is a metal or Mg alloy that getters oxygen; and
        (3) a magnetic moment tuning layer (MMTL) material that is one or more metals where the OCL and MMTL materials form a third interface with each other; and
    (d) a capping layer.

2. The p-MTJ of claim 1 wherein the OCL material is one of Mg, a Mg alloy, Ba, or Ca, and has a thickness of about 0.5 Angstrom to 10 Angstroms.

3. The p-MTJ of claim 1 wherein each of the OCL material and MMTL material form a continuous layer, a discontinuous layer, metal particles, or metal clusters.

4. The p-MTJ of claim 1 wherein the MMTL material is one or more of Nb, Mo, W, Re, Zr, Ru, Rh, Os, Ir, Zn, Pt, Pd, Ga, and Ge, and has a thickness from 0.25 Angstrom to 1.0 Angstrom.

5. The p-MTJ of claim 1 wherein the free layer is a single layer or a multilayer of one or more of Co, Fe, CoFe, CoFeB, CoB, FeB, CoFeNi, and CoFeNiB.

6. The p-MTJ of claim 1 wherein the free layer is comprised of a high Ku material having inherent PMA, which is a Heusler alloy that is $Ni_2MnZ$, $Pd_2MnZ$, $Co_2MnZ$, $Fe_2MnZ$, $Co_2FeZ$, $Mn_3Ge$, or $Mn_2Ga$ where Z is one of Si, Ge, Al, Ga, In, Sn, and Sb, or an ordered $L1_0$ or $L1_1$ material with a composition that is one of MnAl, MnGa, or RT wherein R is Rh, Pd, Pt, Ir, or an alloy thereof, and T is Fe, Co, Ni, or an alloy thereof, or a rare-earth alloy with a TbFeCo, GdCoFe, FeNdB, or SmCo composition.

7. The p-MTJ of claim 1 wherein the free layer has a first sub-layer (FL1) with a thickness t1 that forms the first interface, and a second sub-layer (FL2) with a thickness t2 that forms the second interface, and where a sum (t1+t2) is from 5 Angstroms to 12 Angstroms.

8. The p-MTJ of claim 1 further comprising a seed layer formed on a substrate, and a pinned layer (PL) on the seed layer to yield a seed layer/PL/tunnel barrier layer/FL/Hk enhancing layer/capping layer configuration.

9. The p-MTJ of claim 1 further comprising a seed layer formed on a substrate, and a pinned layer (PL) on the tunnel barrier layer to yield a seed layer/Hk enhancing layer/FL/tunnel barrier layer/PL/capping layer configuration.

10. The p-MTJ of claim 1 wherein the Hk enhancing layer is a single layer or a laminate comprised of an oxide or oxynitride of one or more of Si, Sr, Ti, Ba, Ca, La, Al, Mn, V, and Hf, and has a resistance×area (RA) product less than a RA product of the tunnel barrier layer.

11. The p-MTJ of claim 1 wherein the capping layer is comprised of a metal nitride (MN) or metal oxynitride (MON) where M is one or more of Ti, V, Cr, Zr, Nb, Mo, Hf, Ta, W, and Si.

12. The p-MTJ of claim 7 wherein the OCL material and MMTL material form a stack of layers having an OCL1/MMTL/OCL2 configuration on the FL1 where the first OCL (OCL1) contacts a top surface of the FL1, and the second OCL (OCL2) adjoins a bottom surface of the FL2.

13. The p-MTJ of claim 7 wherein the OCL material and MMTL material form a stack of layers having an OCL/MMTL or MMTL/OCL configuration on the FL1 where one of the OCL and MMTL materials contacts a top surface of the FL1, and the other of the OCL and MMTL materials adjoins a bottom surface of the FL2.

14. The p-MTJ of claim 7 wherein the OCL material is formed within each of the FL1 and FL2, and the MMTL material is formed between the FL1 and FL2.

15. The p-MTJ of claim 7 wherein both of the OCL and MMTL materials are formed within each of the FL1 and FL2, and the OCL material is also formed between the FL1 and FL2.

16. The p-MTJ of claim 7 wherein the OCL material is formed between the FL1 and FL2, and the MMTL material is formed within each of the FL2 and the OCL material.

17. The p-MTJ of claim 1 wherein the p-MTJ is incorporated in a magnetic random access memory (MRAM), spin transfer torque (STT)-MRAM, spin orbit torque (SOT)-MRAM, spin torque oscillator, Spin Hall Effect device, magnetic sensor, or a biosensor.

* * * * *